United States Patent [19]

Hill

[11] Patent Number: 5,239,510
[45] Date of Patent: Aug. 24, 1993

[54] MULTIPLE VOLTAGE SUPPLIES FOR FIELD PROGRAMMABLE GATE ARRAYS AND THE LIKE

[75] Inventor: Dwight D. Hill, Holmdel, N.J.
[73] Assignee: AT&T Bell Laboratories, Murray Hill, N.J.
[21] Appl. No.: 797,648
[22] Filed: Nov. 25, 1991
[51] Int. Cl.$^5$ .............................................. G11C 11/00
[52] U.S. Cl. ..................................... 365/226; 365/154
[58] Field of Search ............... 365/226, 254, 256, 290, 365/202

[56] References Cited

U.S. PATENT DOCUMENTS

| | | | |
|---|---|---|---|
| 4,270,188 | 5/1981 | Saito | 365/154 |
| 4,271,487 | 6/1981 | Crayeraft et al. | 365/154 |
| 4,821,233 | 4/1989 | Hsieh | 365/203 |
| 5,065,362 | 11/1991 | Herdt et al. | 365/154 |

Primary Examiner—Eugene R. LaRoche
Assistant Examiner—Tan Nguyen
Attorney, Agent, or Firm—David I. Caplan

[57] ABSTRACT

A field programmable array of application circuitry (C1, C2, ...) is programmed (or reprogrammed) by first applying application circuitry power supply $(AV_{dd}=5v)$ to the application circuitry, and then applying a binary digital data signal (D0/D1) through the source-drain path of an access transistor (N3) in its on condition to the SRAM that controls the on/off condition of its associated controlled pass transistor (N4). This SRAM is typically one of a row-column array of similar SRAMs, and the access transistors for all SRAMs on the same row are similarly supplied with data signals through access transistors. The source-drain path of each pass transistor is connected between a separate pair of application circuitry interconnection points (A1, A2), whereby the on/off condition of this pass transistor determines whether or not these two points are going to be connected after the programming (or reprogramming) is terminated. While the data signal (D0/D1) is thus being applied to the SRAM, and while the power supply $(PV_{DD})$ for the SRAM is being maintained at an intermediate level (3v) below the level of the application circuitry power supply voltage $(AV_{dd}=5v)$ and below the high binary level (D1), a row-select pulse (S) is applied to a control terminal of the access transistor, as well as to all control terminals of access transistors for accessing all other SRAMs on the same row as the SRAM under discussion. The row-select pulse (S) is then terminated and the SRAMs on other rows (if need be) are similarly written (or rewritten). Then the power supply $(PV_{DD})$ for the SRAMs is increased to a level $(PV_{DD}=6v)$ advantageously higher, by a threshold of the pass transistor (N4), than that of the application circuitry $(AV_{dd}=5v)$, to reduce both voltage drops and power losses in pass transistors. In CMOS technology, in each SRAM the p-channel MOS transistor in both (cross-coupled) inverters have the same thresholds.

12 Claims, 2 Drawing Sheets

MULTIPLE VOLTAGE SUPPLIES FOR FIELD PROGRAMMABLE GATE ARRAYS AND THE LIKE

TECHNICAL FIELD

This invention relates to field programmable gate arrays and more particularly to methods of programming such arrays.

BACKGROUND OF THE INVENTION

In a field programmable gate array, CMOS static random access memory (SRAM) devices ("cells") are commonly used for controlling the on/off (relatively low resistance/relatively high resistance) conditions of high-current paths of interconnection ("pass") transistors, typically n-channel MOS transistors. Each of these memory cells is addressable (accessible) through a high-current path of at least one separate access transistor-typically the source-drain path of an n-channel MOS transistor. The high-current path (typically, n-channel MOS transistor source-drain path) of each pass transistor controls a connection between a pair of controlled ("application") circuitry devices, such as logic gates, buffers, latches, look-up tables, or a combination of them. These application circuitry devices, together with the SRAM cells (including their access transistors), are typically integrated in an integrated circuit semiconductor silicon chip. The devices thus form a "field programmable gate array", reflecting the fact that they thus form an array which can be interconnected (configured; "programmed") or re-interconnected (reconfigured; "reprogrammed") at will in the field (i.e., long after the chip has been fabricated) in accordance with various desired interconnection patterns, by writing or re-writing the SRAM cells by means of applying suitable binary digital data signal voltages to the cells through their respective access transistors. These data signal voltages are selected so as to configure or reconfigure the states of the respective SRAM cells (i.e., to write or re-write the cells) in accordance with the desired resulting on/off (relatively low resistance/relatively high resistance) conditions of the respective pass transistors. In this way, the application circuitry can be programmed or reprogrammed in the field.

In CMOS technology, each of the SRAM cells is typically formed by a pair of cross-coupled inverters, each inverter formed by p-channel MOS transistor whose source-drain path is connected in series with an n-channel MOS transistor. Thus each SRAM cell contains a total of four transistors in the inverters, plus one or more access transistors. The semiconductor chip area consumed by all the SRAM cells, together with their pass transistors, ordinarily consumes a substantial fraction of the total chip area.

In U.S. Pat. No. 4,821,233, each SRAM cell included a pair of cross-connected CMOS inverters. Each pair of inverters was accessed through a single n-channel MOS access transistor, instead of the more usual balanced configuration using two access transistors, to save semiconductor chip area. Each inverter contained a p-channel MOS transistor in series with an n-channel MOS transistor. The p-channel MOS transistor in one of the inverters in each SRAM cell has a different threshold voltage than that of the p-channel MOS transistor in the other. This use of two different p-channel MOS transistor thresholds was required to ensure that—immediately after power was applied to the chip and hence to the inverters, but before every cell had been written with its correct memory state (appropriate to the desired, properly configured application circuitry)—all the not-yet-properly-written cells would maintain their pass transistors in their off conditions, in order to avoid short-circuits in the application circuitry. This is to say, every cell that had not yet been written in a one-memory-cell-row-at-a-time writing procedure would deliver a low voltage level to the gate of its n-channel MOS pass transistor, whereby such a pass transistor would be in its off condition and hence would not enable a short circuit in the application circuitry insofar as the high-current path of such a pass transistor was concerned. Otherwise, owing to the random initial memory states of the memory cells, and hence the random on/off conditions of the pass transistors, undesirably many short-circuits would likely arise in the application circuitry. The use of these different p-channel MOS transistor thresholds, however, requires an extra photolithographic step ("level") for fabricating the cells, whereby processing yields undesirably are reduced and hence manufacturing costs are increased.

One way to avoid this need for the two different p-channel MOS thresholds is a methodology involving re-writing all the SRAM cells with proper information prior to applying power supply voltage to the application circuitry. However, such a methodology requires either an extra (on-chip) electronic switching device or a separate (off-chip) mechanical switching device for controlling the power supply voltage applied to the application circuitry—the former alternative undesirably dissipating excess power and undesirably introducing an unwanted voltage drop across the on-chip switching device, and the latter alternative being unfriendly to the (human) user. Moreover, in order to change the memory state of a cell from that in which its input terminal (i.e., the terminal connected to the access transistor's high-current path) is originally at a low voltage level to that in which its input terminal is at a high voltage level (that is to say, to change the memory cell's state from "low" to "high", i.e., from "0" to "1"), such a methodology, as well as that of the above-mentioned patent, requires that the channel width-to-length ratio of the access transistor be larger than that of at least one of the n-channel MOS transistors of the SRAM cell, whereby extra semiconductor chip area is undesirably needed for the access transistor.

Therefore, it would be desirable to have a methodology that does not suffer from the foregoing shortcomings.

SUMMARY OF THE INVENTION

The foregoing requirements of different thresholds and different channel width-to-length ratios are avoided, by a method of programming (or reprogramming) the application circuitry, the circuitry including an exemplary pair of interconnection points connected through a high-current path of a pass transistor, comprising the steps of:

(a) applying a steady application circuitry power supply voltage having a first voltage level to the application circuitry;

(b) applying a data signal having high/low binary digital signal voltage levels to a first high-current-carrying input terminal of an access transistor having a high-current-carrying output terminal that is connected to the memory cell;

(c) applying to a memory cell supply voltage terminal of the memory cell a memory cell power supply voltage having a second voltage level that is lower than the first voltage level;

(d) applying a voltage pulse, having a third voltage level that is higher than the second voltage level, to a control terminal of the access transistor, whereby the access transistor turns on; and (e) terminating the voltage pulse, whereby the access transistor turns off, followed by increasing the memory cell power supply voltage to a fourth voltage level, whereby the pass transistor has a resistance level that is in accordance with the level of the binary digital signal.

As used herein, the term "high-current-carrying input terminal" refers, for example, to the source or drain terminal of an MOS transistor; and the term "control terminal" refers, for example, to the gate terminal of an MOS transistor. Typically, the memory cell is an SRAM cell in CMOS technology.

In this way, in the case of CMOS technology, the above-described need for two different p-channel MOS transistor thersholds or two different n-channel MOS transistor channel width-to-length ratios is avoided. Advantageously, the fourth voltage level is higher than the first voltage level, by at least a threshold voltage of the pass transistor, in order to reduce the resistance of the (typically n-channel MOS) pass transistor in its on condition and hence to decrease the unwanted voltage drop (IR) across it and to reduce power loss ($I^2R$) dissipated by it, caused by its non-vanishing resistance (R) in its on condition. Also, this use of the higher fourth voltage level facilitates the reading of the cells, making less likely the loss of memory cell information during read operations, caused by removal of storage charge in the cell by virtue of the relatively large capacitance of a data ("bit") line connected to the first high-current-carrying input terminal of the access transistor.

The high binary voltage level and the third voltage level are advantageously selected to be higher than the second voltage level, in order to facilitate the writing of the cell (especially in going from its "low" to its "high" state) without the need of making the transistor channel width-to-length ratio of the pass transistor larger than that of the n-channel MOS transistors in the memory cell. Moreover, for the sake of simplicity of power supply circuitry and its associated switching, the high binary voltage level and the third voltage levels advantageously are made to be equal.

The SRAM cell ("SRAM") can thus be formed simply by a pair of cross-coupled (cross-connected) CMOS inverters of identical construction (i.e., both p-channel MOS transistor channel width/length ratios can be made equal; and both n-channel MOS transistor channel width/length ratios can be made equal to each other) because, during writing, the memory supply voltage is at a (second) level that is less than both that of the voltage pulse (third level) and that of the high binary voltage level. Hence, the data signal has no difficulty, in the otherwise difficult process, in changing the memory state of the SRAM from low to high. In this way, the need for larger widths for some transistors is avoided and chip area is conserved. Also, the SRAM advantageously has one and only one (typically n-channel MOS) access transistor, to conserve semiconductor chip area.

The SRAM cells can be arranged in a row-column matrix array, and written (or re-written), one row at a time, to program (or reprogram) the application circuitry.

Moreover, when power supply voltage is initially applied to all the SRAMs prior to their having been written with proper information (data), the SRAMs are written with random memory states; therefore if application circuitry voltage were to be applied prior to writing the SRAMs row by row (only one row at a time) with their proper data, then the undesirably many short-circuits would likely develop in the application circuitry, whereby undesirably large amounts of power would be dissipated. To avoid this undesirable event, an initialization procedure is performed in which the memory cell supply power voltage delivered to all cells initially is at a level that is low enough to bring all the cell into the memory state that turns off (places in the off condition) all the cells' respective pass transistors regardless of the prior states of the cells, and then all SRAMs in the matrix, i.e., that are located on all rows and columns, are written with a data signal having a (binary) level that maintain all the pass transistors in their off conditions even after the memory cell power supply voltage is subsequently increased to a level—i.e., the second level—that is sufficient to latch the cells but is not as high as that of the high binary level or that of the second level, whereby the entire SRAM matrix is "initialized."

Because the voltage level of the memory cell supply voltage thus being applied to every memory cell power supply voltage terminal during this initialization procedure is initially low enough, typically ground, so as to maintain every pass transistor in its off condition, no short-circuits in the application circuitry can arise during initialization. At the same time, no extra switch is needed for (delayed) application of the application circuitry supply voltage. Any voltage drops or power losses in the switching devices for controlling the application of memory cell supply voltages are minimal, because of the relatively low leakage currents in the memory cells as compared with operating currents in the application circuitry. Moreover, during reprogramming even without again initializing, because of the intermediate level (typically 3 v) of this memory cell supply voltage, any short-circuits that occur in the application circuitry do not dissipate much power, the resistance of the pass transistor then being fairly high and thereby the ($V^2/R$) loss being fairly low.

BRIEF DESCRIPTION OF THE DRAWING(S)

FIG. 1 is a circuit schematic useful for explaining an embodiment of the invention; and FIG. 2 is a timing diagram of voltages to be applied to the circuit schematic of FIG. 1, in accordance with a specific embodiment of the invention.

It should be understood that the schematic depicted in FIG. 1 shows only one (exemplary) SRAM cell, but that in practice there would be many such cells, typically arranged in a row-column matrix, all binary data signal input terminals D of all access transistors N3 located in each column being connected together (to form a "bit line"), and all (row) select terminals S located in each row being connected together (to form a "word line"). Each such SRAM cell controls the on/off condition of its pass transistor N4, which, in turn, controls the resistance between an exemplary pair of points A1 and A2 located in application circuitry C1, C2.

DETAILED DESCRIPTION

Figure 1:
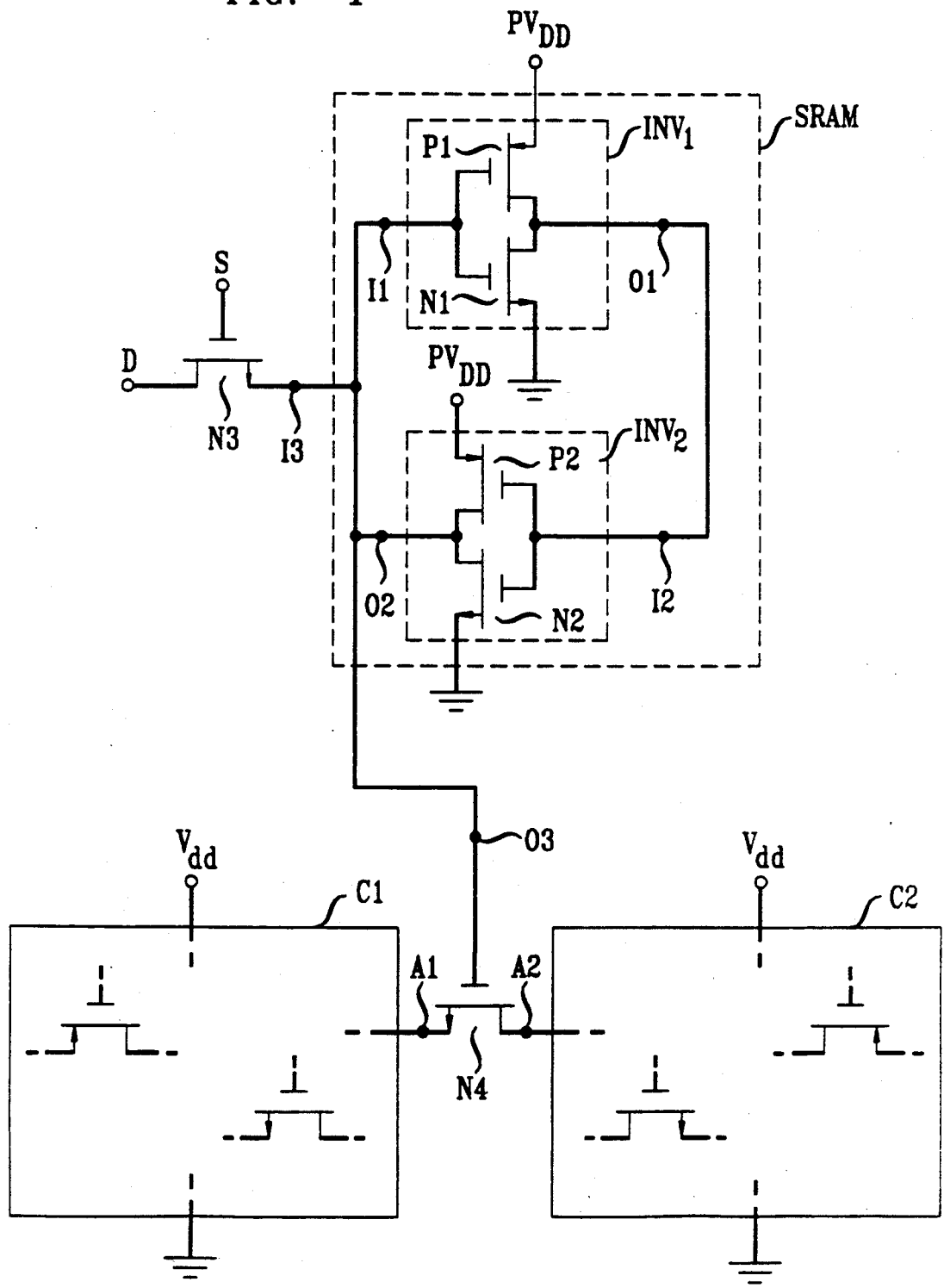

Referring now to FIG. 1, an SRAM cell ("SRAM") is formed by a pair of cross-coupled inverters $INV_1$ and $INV_2$. Inverter $INV_1$ is composed of p-channel MOS transistor P1 and n-channel MOS transistor N1 whose source-drain paths are connected in series between memory cell power supply voltage terminal $PV_{DD}$ and ground, and whose control (gate) terminals are connected together to an input terminal I1 of this inverter $INV_1$. Similarly, inverter $INV_2$ is composed of p-channel MOS transistor P2 and n-channel MOS transistor N2 whose source-drain paths are connected in series between the memory cell power supply terminal $PV_{DD}$ and ground, and whose control (gate) terminals are connected together to an input terminal I2 of this inverter $INV_2$. A node located between the source-drain (current) paths of P1 and N1 is connected to an output terminal O1 of the inverter $INV_1$, and a node between the source-drain (current) paths of P2 and N2 is connected to an output terminal O2 of the inverter $INV_2$. The output terminal O1 is connected to the input terminal I2, and the output terminal O2 is connected to the input terminal I1, thus completing the SRAM cell. This SRAM cell has an input terminal I3 connected to a node located between O2 and I1; it has an output terminal O3 connected to a node located between O2 and I1. Operating voltages (denoted $PV_{DD}$) are delivered to the SRAM cell at the respective memory cell power supply voltage terminals $PV_{DD}$, as more fully described below.

The SRAM is accessed (for changing its memory state) through the source-drain path of the access n-channel MOS transistor N3 having its source-drain path connected between the SRAM cell's input terminal I3 and the binary data signal input terminal D, and having its gate terminal connected to a (row) select input terminal S. The output terminal O3 of the SRAM is connected to the control (gate) terminal of an n-channel MOS pass transistor N4. Depending upon its on/off condition, this pass transistor N4 connects or disconnects the pair of points A1 and A2 in application circuitry C1, C2. Typically, the devices of application circuitry C1, C2 comprise logic gates, buffers, and latches, each of which typically is a CMOS or NMOS device. These devices are supplied with power during operation of the application circuitry by means of a d-c voltage, $AV_{dd}$, typically equal to 5 v, applied to power supply terminals $V_{dd}$ of the application circuitry.

The on/off condition of the pass transistor N4 at any moment of time is determined by the memory state of the SRAM: a high ("1") state of the SRAM (a high voltage level being present at the output terminal O3 of the SRAM) causes N4 to be on; a low ("0") state of the SRAM (a low voltage level being present at the output terminal O3) causes N4 to be off. More specifically, when a row-select voltage pulse (S) pulse is applied to the gate terminal S of the access transistor N3, the pulse having a height that is high enough to turn on this access transistor N3, and the voltage being applied to the cell at its power terminal $PV_{DD}$ is sufficient latch the cell—i.e., sufficient to preserve the cell's memory state after the row-select pulse (S) terminates—then the cell will be written in accordance with a binary digital data signal (D0/D1) being applied to the data signal input terminal D of the access transistor (N3) at the moment of time at which the row-select pulse (S) terminates.

Figure 2:
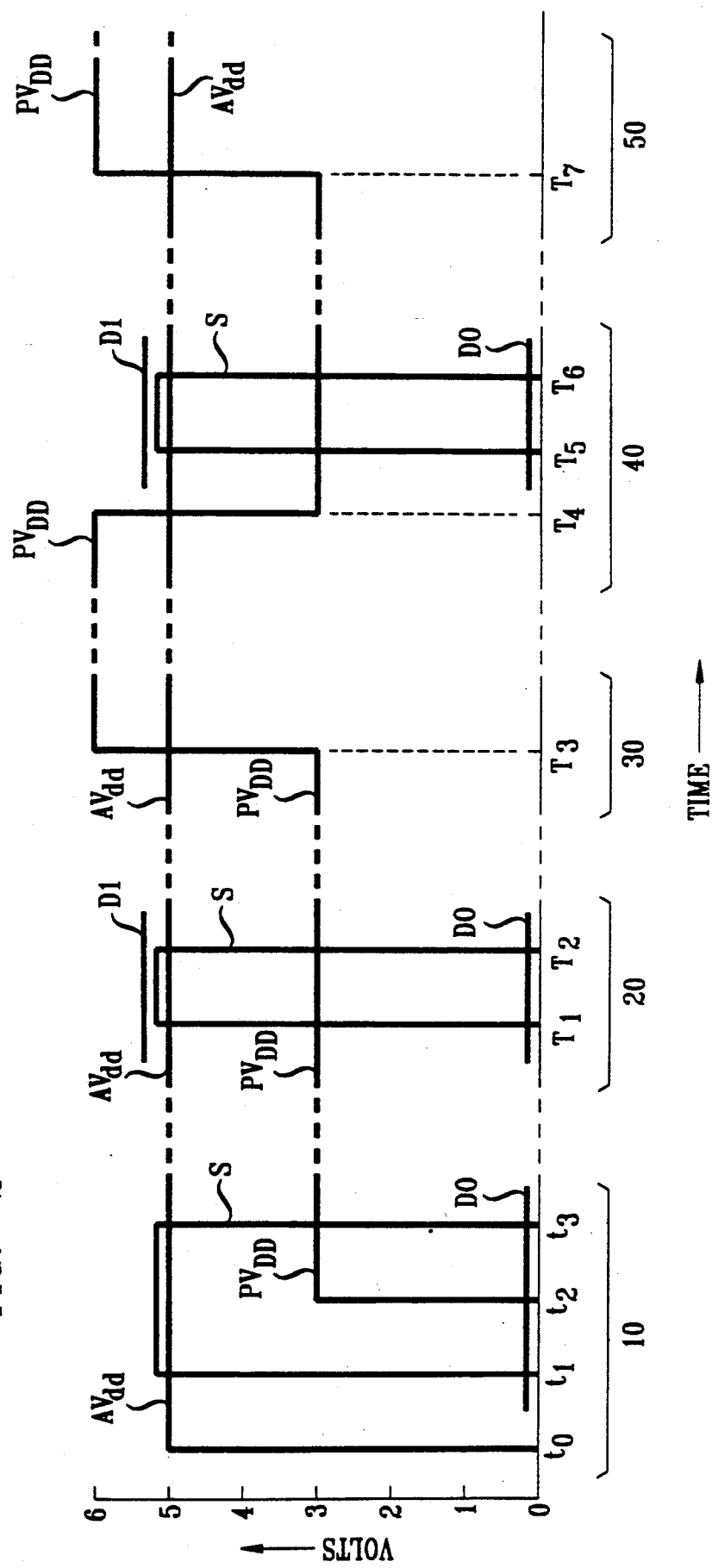

Referring now to FIG. 2, the abscissa represents time, and the ordinate represents voltage. Time interval 10 represents an initialization procedure, to prevent short-circuits that would otherwise be caused by random writing of the SRAM cells during "powering up" of the semiconductor chip—i.e., when power supply voltage is initially applied to the SRAM cells; interval 20 represents an exemplary programming (writing) interval for an exemplary row of the SRAM cell matrix; interval 30 represents a transition interval, viz., from the final programming interval to operation of the application circuitry (C1, C2); interval 40 represents an exemplary reprogramming (re-writing) interval for an exemplary row of the cell matrix, and interval 50 represents a transition interval, viz., from the final reprogramming interval to further operation of the application circuitry.

It should be understood that reading operations (not shown) are performed between intervals 30 and 40, as well as after interval 50.

During the time interval 10, the application circuitry (C1, C2) is "powered up" at time $t_o$—that is, all application circuitry devices receive an application voltage supply $AV_{dd}$ (typically equal to approximately 5 v) applied to terminal $V_{dd}$ (FIG. 1). They continue to receive this voltage $AV_{dd}$ throughout intervals 10, 20, 30, 40, and 50, (unless otherwise desired at the end of intervals 30 or 50, as in cases where it is desired to cease operation of the application circuitry). Next, at time $t_1$, (the leading edge of) a row-select voltage pulse (S) is simultaneously applied to the control (gate) terminals S of all access transistors (N3)—i.e., of all access transistors located on all rows. This row-select pulse (S) continues from $t_1$ to $t_3$.

Commencing preferably at some time prior to time $t_2$ ($t_2$ falling between $t_1$ and $t_3$) and persisting for some time after $t_3$, a binary digital data signal having its low binary level (D0) is applied simultaneously to the data signal input terminals D of all access transistors (N3)—i.e., of all access transistors located on all columns. Also, at time $t_2$, a memory cell supply voltage ($PV_{DD}$) having an intermediate level, typically of about 3 v, is simultaneously applied to the power terminals $PV_{DD}$ of all SRAM cells in the row-column matrix. At all times prior to time $t_2$ the memory supply voltage ($PV_{DD}$) is kept low enough, typically ground, so as to maintain the pass transistor N4 in its off condition and thereby prevent any short-circuits in the application circuitry C1, C2. Next, at time $t_3$ the row-select pulse (S) is terminated, whereby every SRAM cell in the matrix is written with a binary digital "0"—that is, with its output terminal O3 delivering a low voltage level to its pass transistor N4, whereby every pass transistor in the row-column matrix is off, as is desired after initialization.

Advantageously, the voltage level of the memory cell supply voltage ($PV_{DD}$) during the initialization interval 10 is maintained at an intermediate level (typically about 3 v) that is lower than the height of the row-select pulse (S) (typically about 5 v), and is higher than the low binary level of the data signal (typically about 0 v).

After initialization interval 10 has thus been completed, the programming interval 20 is implemented, one row after another. As depicted in FIG. 2, programming of only one row is indicated by the programming interval 20, but it should be understood that such a programming interval is to be applied to all other rows, one row at a time (one row after another).

During all programming intervals 20 (for each row of the matrix), the memory cell power supply voltage ($PV_{DD}$) for all cells is maintained at the same (intermediate) level as it was during the initialization interval 10.

A row-select voltage pulse (S), typically having the same height as it did during the initialization interval 10, is applied during the time interval from $T_1$ to $T_2$ to the row-select input terminal S (hence gate terminal) of the access transistor N3 of every cell on the first row that thus is being addressed and hence will be written first. During the time interval from $T_1$ to $T_2$, a separate binary digital data signal (D0/D1) is applied simultaneously to the data signal input terminal D of each SRAM cell on the row that is being written, each such signal being in accordance with the desired memory state of the respective cell, i.e., in accordance with the desired programming of all cells on the row. The high binary digital level (D1) is typically equal to 5 v; the low value (D0) is typically equal to 0 v. This data signal (D0/D1) signal should not cease to be "valid" until a time subsequent to $T_2$—i.e., it should persist until after $T_2$—and preferably it commences to be "valid" before time $T_1$.

In this way, even in the presence of the voltage drop across the highcurrent path of the access transistor N3, because the resulting input signal (typically about 4 v) being delivered from data signal input terminal D to input terminal I3 of the SRAM cell in case the binary level of the input signal is high (D1), the cells can be more easily written into their binary "1" state, regardless of their previous states, and hence without the need for tailoring the width-to-length ratios of the n-channel MOS transistors. At the same time, this initialization procedure avoids the need of different p-channel MOS transistor thresholds, because at the end of the procedure all pass transistors N4 are in their off conditions. Thus, every SRAM cell on the first row is written with a memory state that depends upon the binary level of the data signal (D0/D1) that was delivered to its data signal input terminal D during the programming interval 20.

Then, one row after another row of cells is similarly written by being subjected to a similar programming interval 20, one row at a time.

After all the cells located on all the rows have thus been written, i.e., the SRAM matrix has thus been programmed, the memory cell power supply voltages (PV$_{DD}$) being delivered to the power terminals PV$_{DD}$ of all SRAM cells in the matrix are increased simultaneously at time $T_3$ (during a single interval 30) to a level that is advantageously higher than that of the application circuitry voltage supply AV$_{dd}$ that is being applied to terminals V$_{dd}$ of the application circuitry C1, C2. Typically, the memory cell power supply voltage (PV$_{DD}$) thus is increased to about 6 v, that is, about 1 v (i.e., at least the threshold of the pass transistor N4) higher than the application circuitry power supply voltage AV$_{dd}$. In this way, the conductances of those pass transistors N4 that are in their condition of being on (low resistance) are desirably high, that is to say, the resistance between exemplary points A1 and A2 is desirably low. After the memory cell supply voltage (PV$_{DD}$) has thus been increased, the application circuitry C1, C2 is ready for operation.

If and when it is desired to reprogram the circuitry, the SRAMs can either be subjected to another initialization interval 10, followed by another sequence of row-by-row writing intervals 20, and transition interval 30. Alternatively, especially in cases where only relatively few rows need to be rewritten, the reprogramming interval 40 can be applied to those rows, and only those rows, that require rewriting, whereby reprogramming time can be saved at the expense of possible temporary short-circuits in the application circuitry. The number of these short-circuits, however, generally tend to be relatively small as compared with the number of potential short-circuits that can occur when the memory cells are randomly written. Also, during the reprogramming interval 40 the memory power supply voltage (PV$_{DD}$) is low enough to maintain the resistance of the pass transistor N4 at a fairly high value (even when the memory state of its SRAM cell is "1" and thus tends to turn on its pass transistor N4) whereby the (V$^2$/R) power losses due to the temporary short-circuits are relatively unimportantly low.

If it is thus desired to avoid the task of initialization and rewriting all rows, then at time $T_4$ of the reprogramming interval 40, the memory cell power supply voltage (PV$_{DD}$) for all cells in the matrix is reduced, typically to 3 v, while the application circuitry supply voltage (AV$_{dd}$) can be maintained, typically at about 5 v. Next, beginning at time $T_5$ a row-select pulse (S), having a height of typically also about 5 v, is applied to the control terminals S of all access transistors N3 located on the row being written. Before this row-select pulse (S) terminates and preferably before it commences, binary digital data signals (D0/D1) are applied to the data signal input terminals of all access transistors N3 located on that row, each such data signal having a voltage level in accordance with the desired reprogramming (rewriting) of the respective cell. The row-select pulse then terminates at time $T_6$, whereby all SRAM cells on the row are rewritten, and the reprogramming interval 40 has been completed for that row. Thereafter, the other rows that are to be rewritten are subjected to a similar reprogramming interval 40. No other rows need be rewritten. Finally, after all rows that require rewriting have thus been rewritten, say at time $T_7$, the transition interval 50 commences, and the memory power supply voltage (PV$_{DD}$) being delivered to all SRAM cells in the matrix at their power supply terminals PV$_{DD}$ is increased simultaneously to a level again that is advantageously higher, by a threshold voltage of the pass transistor N4, than that of the application circuitry power supply voltage (AV$_{dd}$)—i.e., typically to about 6 v, i.e., about one volt higher than that of the application circuitry power supply voltage.

Although the invention has been described with respect to a specific embodiment, various modifications can be made without departing from the scope of the invention. For example, the memory cells can be realized in bipolar technology, as can be the access transistors, the pass transistors, and the application circuitry devices.

I claim:

1. A method of programming (40) or reprogramming (40) and operating application circuitry, the circuitry including a pair of interconnection points connected through a high-current path of a pass transistor whose resistance is controlled by a memory cell, comprising the steps of:

(a) applying a steady application circuitry power supply voltage having a first voltage level to the application circuitry;

(b) applying a data signal having high/low binary digital signal voltage levels to a first high-current-carrying input terminal of an access transistor having a high-current-carrying output terminal that is connected to the memory cell, the access transistor having relatively high and relatively low resistance conditions;

(c) applying to a memory cell supply voltage terminal of the memory cell a memory cell power supply voltage having a second voltage level that is lower than the high binary voltage level;

(d) applying a voltage pulse, having a third voltage level that is higher than the second voltage level, to a control terminal of the access transistor, whereby the access transistor is in its relatively low resistance condition; and (e) terminating the voltage pulse, whereby the access transistor is in its relatively high resistance condition, followed by increasing the memory cell power supply voltage to a fourth voltage level, whereby the pass transistor has a resistance level that is in accordance with the level of the binary digital signal.

2. The method of claim 1 in which the fourth voltage level is greater than the first voltage level by at least a threshold voltage of the pass transistor.

3. The method of claim 1 or 2 in which the first and third voltage levels are equal.

4. The method of claim 1 or 2 in which the high binary voltage level, the first voltage level, and the third voltage level are mutually equal.

5. The method of claim 1 in which the memory cell comprises a pair of cross-coupled CMOS inverters, the threshold voltages of all n-channel MOS transistors in the cell being equal, and the threshold voltages of all p-channel MOS transistors in the cell being equal, the memory cell having one and only one access transistor.

6. The method of claim 5 in which the fourth voltage level is greater than the first voltage level.

7. The method of claim 5 or 6 in which the first and third levels are equal.

8. The method of claim 5 or 6 in which the high binary voltage level, the first voltage level, and the third voltage level are mutually equal.

9. A method of initializing (20) followed by programming (20) and operating application circuitry comprising the steps recited in claim 1 further including the steps of:

(a) applying to the memory cell supply voltage terminal of the memory cell a memory cell power supply voltage having a level that is sufficiently low to maintain an output terminal of the cell at a voltage that is low enough to maintain the pass transistor in a relatively high resistance condition regardless of any previous state of the memory cell;

(b) increasing the application circuitry power supply voltage to the first voltage level, whereby the application circuitry power supply voltage has a first rising edge;

(c) applying, to the high-current-carrying input terminal of the access transistor, a voltage that is suitable for maintaining the pass transistor in its relatively high resistance condition;

(d) applying, to the control terminal of the access transistor, a second voltage pulse having a second rising edge that is subsequent in time to the first rising edge, the second voltage pulse having the third voltage level;

(e) applying the memory supply voltage having the second voltage level, and having a third rising edge that is subsequent in time to the second rising edge; and (f) terminating the second voltage pulse.

10. The method of claim 9 in which the first and third voltage levels are equal.

11. The method of claim 9 in which the memory cell comprises a pair of cross-coupled CMOS inverters, the threshold voltages of all n-channel MOS transistors in the cell being equal, and the threshold voltages of all p-channel MOS transistors in the cell being equal, the memory cell having one and only one access transistor.

12. The method of claim 11 in which the first and third voltage levels are equal.

* * * * *

UNITED STATES PATENT AND TRADEMARK OFFICE
CERTIFICATE OF CORRECTION

PATENT NO.   : 5,239,510
DATED        : August 24, 1993
INVENTOR(S)  : Dwight D. Hill It is certified that error appears in the above-identified patent and that said Letters Patent is hereby corrected as shown below:

Column 8, claim 1, line 55, delete "(40)".
    Column 8, claim 1, line 56, delete "(40)".
    Column 10, claim 9, line 1, delete "(20)".
    Column 10, claim 9, line 2, delete "(20)".

Signed and Sealed this

Twentieth Day of September, 1994

Attest:

BRUCE LEHMAN

*Attesting Officer*      *Commissioner of Patents and Trademarks*